United States Patent [19]
Chen et al.

[11] Patent Number: 6,100,586
[45] Date of Patent: Aug. 8, 2000

[54] LOW VOLTAGE-DROP ELECTRICAL CONTACT FOR GALLIUM (ALUMINUM, INDIUM) NITRIDE

[75] Inventors: Yong Chen, Mountain View; Long Yang, Union City; Shih-Yuan Wang, Palo Alto; Richard P. Schneider, Mountain View, all of Calif.

[73] Assignee: Agilent Technologies, Inc., Palo Alto, Calif.

[21] Appl. No.: 08/862,461

[22] Filed: May 23, 1997

[51] Int. Cl.$^7$ ...................................................... H01L 21/28
[52] U.S. Cl. ............................................ 257/745; 257/615
[58] Field of Search ...................................... 257/615, 745; 438/605, FOR 344, FOR 349, FOR 480

[56] References Cited

U.S. PATENT DOCUMENTS

| | | |
|---|---|---|
| 4,024,569 | 5/1977 | Hawrylo et al. . |
| 5,652,434 | 7/1997 | Nakamura et al. . |
| 5,679,965 | 10/1997 | Schetzina . |

FOREIGN PATENT DOCUMENTS

| | | |
|---|---|---|
| 0042066 | 12/1981 | European Pat. Off. . |
| 2696278 | 4/1994 | France . |
| 06037355 | 2/1994 | Japan . |
| 07283167 | 10/1995 | Japan . |
| 08213651 | 8/1996 | Japan . |

OTHER PUBLICATIONS

"Higher Visibility for LEDS", IEEE Spectrum, vol. 31, No. 7, Jul. 1994, pp. 30–34, 39.

Primary Examiner—George Fourson

[57] ABSTRACT

An electrical contact that comprises a layer of a p-type gallium nitride material, a metal layer, and an intermediate layer of a material different from the gallium nitride material and the metal layer. The intermediate layer is sandwiched between the layer of p-type gallium nitride material and the metal layer. The material of the intermediate layer may be a Group III–V semiconductor that has high band-gap energy, lower than that of the p-type gallium nitride material. The intermediate layer may alternatively include layers of different Group III–V semiconductors. The layers of the different Group III–V semiconductors are arranged in order of their band-gap energies, with the Group III–V semiconductor having the highest band-gap energy next to the layer of the p-type gallium nitride material, and the Group III–V semiconductor having the lowest band-gap energy next to the metal layer. As a further alternative, the material of the intermediate layer may be a metal nitride. As a yet further alternative, the material of the intermediate layer may be a gallium nitride material in which a percentage of the nitrogen atoms are replaced by a mole fraction x of atoms of at least one other Group V element. The value of x is close to zero next to the p-type gallium nitride material, and is substantially greater next to the metal layer. This intermediate layer may alternatively be sandwiched between a layer of n-type gallium nitride material and a metal layer to make an n-contact.

20 Claims, 2 Drawing Sheets

LOW VOLTAGE-DROP ELECTRICAL CONTACT FOR GALLIUM (ALUMINUM, INDIUM) NITRIDE

FIELD OF THE INVENTION

The invention relates to an electrical contact to gallium (Al, In) nitride, and, in particular, to an electrical contact suitable for making an electrical connection to the p-type gallium nitride of a semiconductor device such as a blue-emitting laser.

BACKGROUND OF THE INVENTION

Semiconductor materials such as gallium nitride (GaN), aluminum gallium nitride (AlGaN), indium gallium nitride (InGaN) and aluminum indium gallium nitride (AlInGaN) are used in many different semiconductor devices. In particular, such semiconductor materials are used in transistors, and in vertical-cavity surface-emitting lasers (VCSELs), in-plane lasers, and light-emitting diodes (LEDs) structured to emit light ranging in wavelength from red through ultra-violet. In the following description, the term gallium nitride material will be understood to refer to any of the above-mentioned semiconductor materials.

Semiconductor devices made from gallium nitride materials commonly include one or more electrical contacts through which electric current received via a bonding wire is distributed across the surface of the gallium nitride material for conduction through the bulk of the gallium nitride material. To minimize heat generation in the semiconductor device, the electrical resistance of the electrical contact, and the voltage drop across the p-contact, should be a minimum.

Electrical contacts made to gallium nitride materials include n-contacts made to gallium nitride materials doped with donor impurities, and p-contacts made to gallium nitride materials doped with acceptor impurities. Of these two types of contact, obtaining a p-contact with a low contact resistance and low voltage drop is the more difficult.

Conventional semiconductor devices using gallium nitride materials form a p-contact by depositing a conductive metal directly on the surface of the p-type gallium nitride material. For example, in such conventional devices, a thin layer of a metal such as titanium, nickel or palladium may be deposited directly on the surface of the p-type gallium nitride material. A much thicker layer of gold is then deposited on the thin layer of metal. A thin intermediate layer of platinum may be interposed between the thin layer of metal and the thicker layer of gold.

Two main mechanisms prevent a conventional p-contact from having the desirable electrical characteristics stated above. First, the large work function difference between the gallium nitride material and the metal establishes a high potential barrier between the gallium nitride material and the metal. For gallium nitride, the potential barrier is typically about 3.4 V. Second, the maximum level of activated acceptor impurities that currently can be reliably achieved in gallium nitride materials is between $10^{17}$–$10^{18}$ atoms.cm$^{-3}$. This results in the p-type gallium nitride having a contact resistivity in the range $10^{-1}$–$10^{-2}$ ohm.cm$^2$. This maximum level of activated acceptor impurities is at least one order of magnitude below that which will provide a contact resistivity in the range $10^{-4}$–$10^{-5}$ ohm.cm$^2$. A contact resistivity in the range $10^{-4}$–$10^{-5}$ ohm.cm$^2$ is desirable for the p-contact to have an acceptably-low electrical resistance.

The low concentration of activated acceptor (p-type) impurities that can be achieved in a gallium nitride material is especially problematical in combination with the high potential barrier between the gallium nitride material and the layer of metal because it results in a wide depletion region that extends into the gallium nitride material from the interface between the layer of metal and the gallium nitride material.

Moreover, in practical devices, the depletion zone is wider than that predicted from the potential barrier and the level of activated acceptor impurities in the gallium nitride material. This is because the effective level of activated acceptor impurities in the gallium nitride material next to the metal contact is lower than in similarly-doped bulk material. At the metal-gallium nitride material interface of the p-contact, the metal typically reacts with the nitrogen of the gallium nitride material to form metal nitrides. This removes nitrogen atoms from the gallium nitride material, leaving nitrogen vacancies in the gallium nitride material. The nitrogen vacancies act as donor sites that neutralize adjacent acceptor sites in the gallium nitride material and lower the effective concentration of activated acceptor impurities. This further widens the depletion zone.

The voltage drop across conventional light-emitting devices using gallium nitride material is typically in the range of 5–7 volts. Of this voltage drop, only about 3 volts is accounted for by the diode voltage of the device. Most of the rest of the voltage drop is due to the voltage drop of the p-contact.

A p-contact for a gallium nitride material that does not suffer from the disadvantages of known p-contacts is desirable, since such a p-contact would reduce heat dissipation in the semiconductor devices employing such contacts. In particular, a p-contact that would enable a gallium nitride material semiconductor device, such as a light-emitting device, to have a forward voltage drop close to the diode voltage of the gallium nitride material is desirable.

SUMMARY OF THE INVENTION

The invention provides an electrical contact for a semiconductor device. The electrical contact comprises a layer of p-type gallium nitride material, a metal layer, and an intermediate layer sandwiched between the semiconductor layer and the metal layer. The intermediate layer is a layer of a material different from the gallium nitride material and the metal.

The material of the intermediate layer may be a Group III–V semiconductor that has a high band-gap energy, lower than that of the p-type gallium nitride material. The intermediate layer may alternatively include layers of different Group III–V semiconductors. The layers of the different Group III–V semiconductors are arranged in order of their band-gap energies, with the Group III–V semiconductor having the highest band-gap energy next to the layer of the p-type gallium nitride material, and the Group III–V semiconductor having the lowest band-gap energy next to the metal layer.

As a further alternative, the material of the intermediate layer be a metal nitride.

The invention also provides an electrical contact for a semiconductor device. The electrical contact comprises a layer of doped gallium nitride material, a metal layer, and an intermediate layer sandwiched between the doped semiconductor layer and the metal layer. The intermediate layer is a gallium nitride material in which a mole fraction (1−x) of nitrogen atoms are replaced by a mole fraction x of atoms of at least one other Group V element. The mole fraction x in the intermediate layer is close to zero next to the doped gallium nitride material, and is substantially greater than zero next to the metal layer. The mole fraction x in the intermediate layer next to the metal layer preferably has a value that provides a band-gap energy of less than one electron volt.

Finally, the invention provides a method of reducing the resistivity of, and the voltage drop across, an electrical contact to a p-type gallium nitride material. In the method, a p-contact including the gallium nitride material and a metal layer are provided, and an intermediate layer is sandwiched between the layer of the gallium nitride material and the metal layer. The intermediate layer is a layer of a material different from the gallium nitride material and the metal.

The intermediate layer may be a single layer of material. The material of the intermediate layer may be a Group III–V semiconductor that has a high band-gap energy, lower than that of the gallium nitride material. The material of the intermediate layer may alternatively be a metal nitride.

Alternatively, the intermediate layer may be formed by arranging layers of different Group III–V semiconductors between the p-type gallium nitride material and the metal layer. The layers of the different Group III–V semiconductors are arranged in order of their band-gap energies, with the Group III–V semiconductor having the highest band-gap energy next to the layer of p-type gallium nitride material, and the Group III–V semiconductor having the lowest band-gap energy next to the metal layer.

As a further alternative, sandwiching the intermediate layer may include growing a layer of gallium nitride in which a mole fraction (1−x) of the nitrogen atoms have been replaced by a mole fraction x of atoms of at least one other Group V element on the p-type gallium nitride material as the intermediate layer. The mole fraction x is increased and the mole fraction (1−x) is decreased as the intermediate layer grows in thickness towards a desired thickness. The metal layer is then deposited on the intermediate layer.

DETAILED DESCRIPTION OF THE INVENTION

Figure 1:
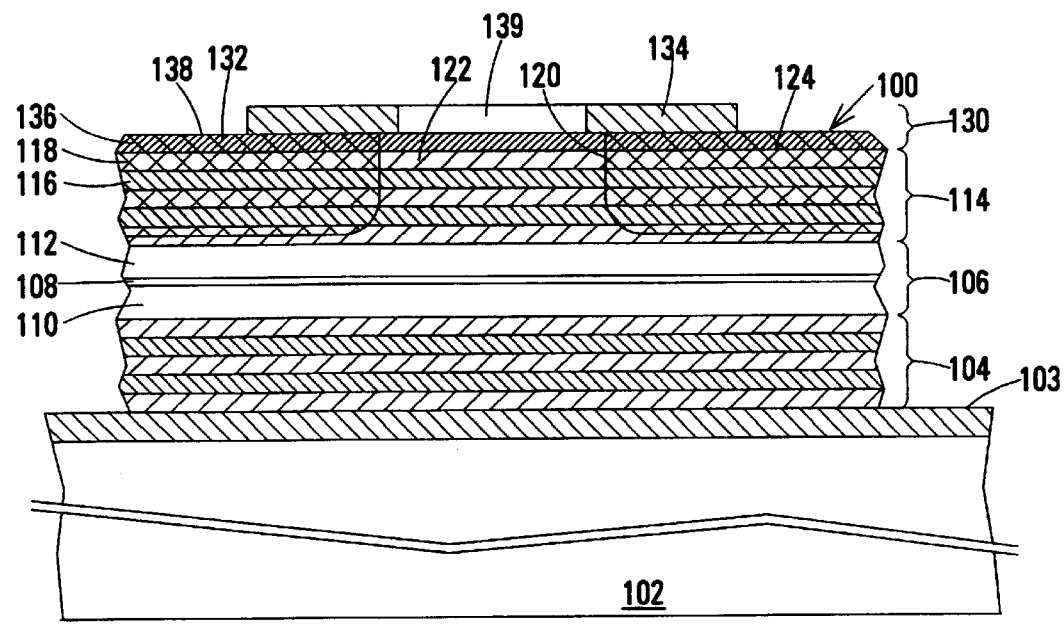
FIG. 1 is a cross-sectional view showing a vertical-cavity surface-emitting laser (VCSEL) as an example of a gallium nitride material semiconductor device incorporating a first embodiment of a p-contact according to the invention.

FIG. 1 is a cross-sectional view showing a VCSEL 100 as an example of a semiconductor device made using gallium nitride material and that incorporates a first embodiment of a p-contact according to the invention. Applications of the p-contact according to the invention are not restricted to VCSELs, but may include any semiconductor device that employs a p-type gallium nitride material. As noted above, the term gallium nitride material encompasses gallium nitride, and gallium nitride in which a fraction of the gallium atoms have been replaced by aluminum atoms, indium atoms, or aluminum or indium atoms.

In the VCSEL 100, the lower mirror region 104 is grown on the layer 103 deposited on the substrate 102. The substrate is preferably sapphire. The layer 103 is a layer of n-type gallium nitride material. The active region 106 is grown on the lower mirror region 104. The active region includes the light-generating layer 108. The light generating layer is preferably composed of indium gallium nitride quantum wells sandwiched between two gallium nitride or aluminum gallium nitride buffer regions 110 and 112. Alternatively, the light-generating layer may be a layer of bulk gallium nitride or indium gallium nitride. The wavelength of the light generated by the VCSEL 100 depends on the material of the quantum wells or the bulk material. The upper mirror region 114 is grown on top of the active region 106.

Both mirror regions 104 and 114 are composed of alternating mirror layers of aluminum nitride or aluminum gallium nitride and a gallium nitride material such as gallium nitride or aluminum gallium nitride. When the mirror layers are alternating layers aluminum gallium nitride, the aluminum mole fraction is different in adjacent layers. Each mirror layer has a thickness of $\lambda_n/4$, where $\lambda_n$ is the wavelength of the light generated in the light-generating layer 108 in the semiconductor material of the mirror layer. The mirror layers of the upper and lower mirror regions collectively constitute a respective distributed Bragg reflector. Each distributed Bragg reflector has a high reflectivity at the wavelength of the light generated in the light-generating layer. The aluminum nitride mirror layer 116 and the gallium nitride material mirror layer 118 are shown as examples of the mirror layers constituting the upper mirror region 114.

Each of the upper and lower mirror regions 104 and 114 is shown in FIG. 1 with only five mirror layers to simplify the drawing. In actual devices, the mirror regions are composed of between about five and about 30 pairs of mirror layers similar to the pair of mirror layers 116 and 118.

The mirror regions 104 and 114 are made electrically conductive by doping the semiconductor materials of these regions with suitable impurities. In the example shown, the semiconductor materials of the lower mirror region 104 are doped with donor (n-type) impurities, and the semiconductor materials of the upper mirror region 114 are doped with acceptor (p-type) impurities. The quantum wells in the light-generating layer 108 are substantially undoped, so that the upper mirror region, the light-generating layer and the lower mirror region collectively constitute a p-i-n diode.

The implant zone 120 reduces the electrical conductivity of upper mirror region 114 outside a central core zone 122 to confine current flow through the upper mirror region to the core zone. The implant zone also confines current flow through the active region 106 to a central zone substantially coextensive with the core zone. The implant region is a zone of the upper mirror region in which suitable ions, such as hydrogen ions, are implanted after the upper mirror region has been formed. Alternatively, a peripheral zone (not shown) of one or more of the mirror layers constituting the upper mirror region adjacent the active region 106 can be oxidized to define the central core zone 122. The oxidized zone is a zone of reduced conductivity, and provides a current confinement structure that has the same effect as the implant zone 120. As a further alternative, other ways of reducing the conductivity of a peripheral zone (not shown) of one or more of the mirror layers constituting the upper mirror region adjacent the active region 106 can be used to define the central core zone.

The VCSEL 100 emits light in response to an electric current passed in the forward direction through the p-i-n diode formed by the upper mirror region 114, the active region 106 and the lower mirror region 104. Electrical connections to the upper and lower mirror regions are made through respective metal layers. The metal layer 105 is deposited on the n-type gallium nitride layer 103 outside the semiconductor layers constituting the lower mirror region, the active region and the upper mirror region and forms a conventional n-contact with the n-type GaN layer 103. The electrical connection between the metal layer 105 and the n-type lower mirror region 104 is made through the n-type gallium nitride layer 103.

In the VCSEL 100 shown in FIG. 1, the electrical connection to the p-type upper mirror region 114 is made by the first embodiment 130 of the p-contact according to the invention. This p-contact does not suffer from the above-mentioned performance problems of a conventional p-contact. The p-contact 130 is formed on the upper surface 124 of the topmost p-type gallium nitride material layer 118 of the upper mirror region and is composed of the conductive intermediate layer 132 sandwiched between the topmost p-type gallium nitride material layer 118 and the metal layer 134.

In the p-contact 130, the material of the intermediate layer 132 is a high band-gap energy Group III–V semiconductor. The Group III–V semiconductor of the intermediate layer is different from that of the p-type gallium nitride material layer 118. The intermediate layer is deposited on the upper surface 124 of the topmost p-type gallium nitride material layer 118 of the upper mirror region 114.

The metal layer 134 is composed at least one layer of a suitable metal deposited on the upper surface 138 of the intermediate layer. In a practical embodiment, the metal layer 134 is composed of layers of three different metals. A layer of nickel about 100 Å thick is deposited on the upper surface of the intermediate layer. A layer of titanium, also about 100 Å thick, is deposited on the layer of nickel, and a layer of gold about 5000 Å thick is deposited on the layer of titanium. The layers constituting the metal layer 134 are not shown in FIG. 1 to simplify the drawing.

In a VCSEL, such as the VCSEL 100 shown in FIG. 1, in which the light generated by the VCSEL is emitted from the upper surface 124, remote from the substrate 102, the metal layer 134 includes the window 139. The window is formed by selectively depositing the metal layer, or by depositing the metal layer, and then selectively removing part of the metal layer.

As noted above, the material of the intermediate layer 132 is a Group III–V semiconductor having a high band-gap energy, but one that is lower than that of the topmost p-type gallium nitride material layer 118 of the upper mirror region 114. The material of the intermediate layer is doped to as high a level as possible with acceptor impurities to make the resistivity of the intermediate layer as low as possible, and to make the depletion zone in the intermediate layer as narrow as possible.

If band-gap energy of the material of the intermediate layer 132 is less than the quantum energy of the light generated by the VCSEL 100, the intermediate layer will be opaque to the light. In this case, a window (not shown) corresponding to the window 139 must be formed in the intermediate layer to allow the VCSEL to emit the light it generates. The window is formed by selectively depositing the material of the intermediate layer, or by depositing the material of the intermediate layer, and then selectively removing part of the intermediate layer. When a window is formed in the intermediate layer as just described, the preferred thickness of the intermediate layer ranges from about 500 Å to about 3,000 Å.

If no window is formed in the intermediate layer 132, so that the intermediate layer underlies the window 139, the thickness of the intermediate layer should be an integral multiple of $\lambda_n/2$, where $\lambda_n$ is the wavelength of the light generated in the light-generating region 106 in the material of the intermediate layer. With a thickness that is an integral multiple of $\lambda_n/2$, light reflected at the surface 138 is in phase with the light reflected at all of the surfaces of the upper mirror layer 114. The intermediate layer has a current spreading effect, so it is desirable to make this layer relatively thick. A thickness that is an integral multiple of $\lambda_n/2$ and that is about 1 μm can be used, for example.

The preferred material of the intermediate layer 132 is gallium phosphide (GaP). GaP is preferred because, of the Group III–V semiconductors other than the gallium nitride materials, this material has a band-gap energy closest to, but less than, the band gap energies of the gallium nitride materials. GaP has a band-gap energy of 2.26 eV, whereas gallium nitride has a band-gap energy of 3.4 eV. GaP is also preferred because, with present doping techniques, it is capable of being more heavily doped with acceptor impurities than the gallium nitride materials. Active impurity levels as high as $10^{20}$ atoms.cm$^{-3}$ can be currently achieved. The relatively high band-gap energy of GaP reduces the voltage drop at the gallium phosphide/gallium nitride material junction. The high active doping level that can be achieved in GaP reduces the contact resistivity of the GaP to about $10^{-3}$–$10^{-4}$ ohm.cm$^2$ when the metal layer 134 is deposited directly on the layer 136. Although this resistivity is not as low as desired, it is lower than that achieved with a conventional p-contact to a gallium nitride material.

An alternative material for the intermediate layer 132 is a gallium nitride material that has a lower band-gap energy than that of the topmost p-type gallium nitride material layer 118 of the upper mirror region 114. For example, if the topmost p-type gallium nitride material layer 118 is a layer of aluminum gallium nitride, the material of the intermediate layer may be indium gallium nitride, gallium nitride, or aluminum gallium nitride with a substantially lower mole fraction of aluminum atoms than that of the layer 118. If the topmost p-type gallium nitride material layer 118 is a layer of gallium nitride, the material of the intermediate layer may be indium gallium nitride. If the topmost p-type gallium nitride material layer 118 is a layer of indium gallium nitride, the material of the intermediate layer may be indium gallium nitride with a substantially larger mole fraction of indium atoms.

The VCSEL 100 may be made by growing a layer structure in a MOCVD reactor, and dividing the layer structure into individual VCSELs or VCSEL arrays. The layer structure including the intermediate layer 132 of the p-contact 130 can be grown in a conventional nitride-process MOCVD reactor modified to include the phosphine feed required to grow the intermediate layer.

Figure 2:
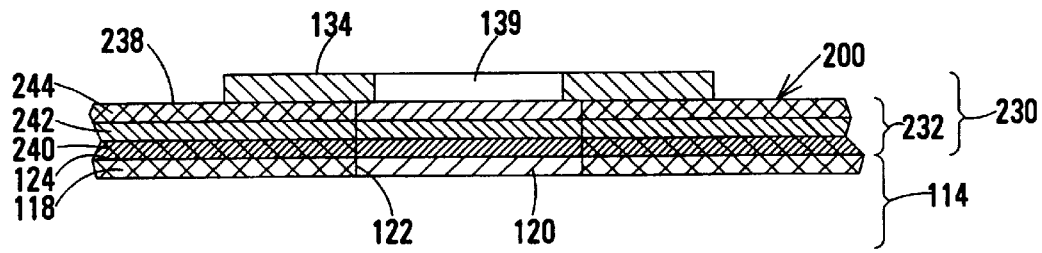
FIG. 2 is a cross-sectional view showing part of a VCSEL as an example of a gallium nitride material semiconductor device incorporating a second embodiment of a p-contact according to the invention.

FIG. 2 shows the VCSEL 200 as an example of a gallium nitride semiconductor device incorporating a second embodiment 230 of a p-contact according to the invention. To simplify the drawing, FIG. 2 shows only the topmost p-type gallium nitride material layer 118, the composite intermediate layer 232 and the metal layer 134 of the VCSEL 200. The rest of the VCSEL 200 is identical to the VCSEL 100 shown in FIG. 1 and has been omitted. Elements that are identical to those shown in FIG. 1 are indicated by the same reference numeral and will not be described again here.

In the second embodiment shown in FIG. 2, the p-contact 230 according to the invention is formed on the upper surface 124 of the topmost p-type gallium nitride material layer 118 of the upper mirror region 114. The p-contact 230 is composed of the metal layer 134 and the composite intermediate layer 232 sandwiched between the topmost p-type gallium nitride material layer 118 and the metal layer. The composite intermediate layer 232 is composed of layers of different semiconductors. Each of the semiconductors is a Group III–V semiconductor different from the semiconductor material of the p-type gallium nitride material layer 118. Each of the Group III–V semiconductors has a band-gap energy. The layers of the different semiconductors are arranged in order of band-gap energy, with the Group III–V semiconductor having the highest band-gap energy next to the topmost p-type gallium nitride material layer 118, and the Group III–V semiconductor having the lowest band-gap energy next to the metal layer 134.

The composite intermediate layer 232 is more effective at reducing the voltage drop at the p-contact 230 than the intermediate layer 132 composed of the single layer of a Group III–V semiconductor shown in FIG. 1 because of the progressively-reducing band-gap energies of the Group III–V semiconductors disposed between the gallium nitride material layer and the metal layer 134.

In the composite intermediate layer 232, the Group III–V semiconductor of the layer adjacent the gallium nitride material layer of the upper mirror region is preferably GaP because, of the Group III–V semiconductors other than the gallium nitride materials, this material has a band-gap energy closest to, but less than, the band gap energies of the gallium nitride materials. The Group III–V semiconductors in the layers between the GaP layer and the metal layer 134 have lower band-gap energies than that of GaP, but are preferably Group III–V semiconductors that can be doped to much greater impurity levels than GaP.

In the example shown in FIG. 2, the composite intermediate layer 232 is composed of the layer 240 of gallium phosphide (GaP) contacting the top surface 124 of the topmost p-type gallium nitride material layer 118 of the upper mirror region 114, the layer 242 of aluminum indium gallium phosphide (AlInGaP) contacting the GaP layer 240, and the layer 244 of indium gallium phosphide (InGaP) contacting the AlInGaP layer 242. The metal layer 134 is deposited on the surface 238 of the composite intermediate layer, i.e., on the surface of the InGaP layer remote from the AlInGaP layer.

If the band-gap energy of the material of any of the Group III–V semiconductor layers constituting the composite intermediate layer 232 is less than the quantum energy of the light generated by the VCSEL 200, the Group III–V semiconductor layer will be opaque to the light. In this case, a window corresponding to the window 139 must be formed in the Group III–V semiconductor layer to allow the VCSEL to emit the light it generates. The window is formed by selectively depositing the Group III–V semiconductor layer, or by depositing the Group III–V semiconductor layer, and then selectively removing part of the Group III–V semiconductor layer.

In the example shown in FIG. 2, the band-gap energy of the Group III–V semiconductor layers 240, 242 and 244 constituting the composite intermediate layer 232 is less than the quantum energy of the light generated by the VCSEL 200. Consequently, the window 246 is shown extending through all three of the layers 240, 242 and 244. Alternatively, depending on the wavelength of the light generated by the VCSEL 200, the window 246 may extend through only the Group III–V semiconductor layer 244, or through the Group III–V semiconductor layers 244 and 242, or the window 246 may be omitted. The preferred thickness of the Group III–V semiconductor layers that constitute the composite intermediate layer 232 and in which a window is formed ranges from about 500 Å to about 3,000 Å.

If part of any of the Group III–V semiconductor layers constituting the composite intermediate layer 232 underlies the window 139, the thickness of such Group III–V semiconductor layer should be an integral multiple of $\lambda_n/2$, where $\lambda_n$ is the wavelength of the light generated in the light-generating region 106 in the material of the Group III–V semiconductor layer. Group III–V semiconductor layers underlying the window 139 have a current spreading effect, so it is desirable to make these layers relatively thick. A thickness about 1 μm that is an integral multiple of $\lambda_n/2$ can be used, for example.

Each of the Group III–V semiconductor layers constituting the composite intermediate layer 232 is doped with an acceptor (p-type) impurity to as high an impurity level as possible. With current techniques, the GaP layer 240, the AlInGaP layer 242 and the InGaP layer 244 can each be doped to as high as $10^{20}$ atoms.cm$^{-3}$ of activated acceptor impurities.

The composite intermediate layer 232 may include fewer or more layers than the number of layers shown in FIG. 2. Moreover, Group III–V semiconductors other than GaP, AlInGaP and InGaP may be used to form the composite intermediate layer 232. For example, a layer of indium gallium phosphide (InGaP) may be used for a layer, such as the layer 242, in the middle of the composite intermediate layer. It is advantageous to form the layer 244, next to the metal layer 134, from gallium arsenide nitride (GaAsN) due to the very low band-gap energy of this material. InGaAs could be used in the layer 244. The layer 240 next to the p-type gallium nitride material layer 118 may be a gallium nitride material that has a lower band-gap energy than that of the topmost p-type gallium nitride material layer 118 of the upper mirror region 114, as described above with reference to FIG. 1.

Figure 3:
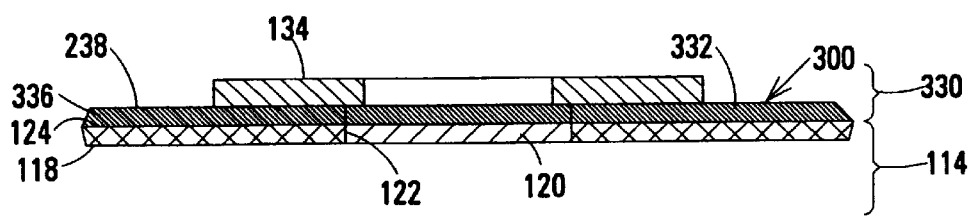
FIG. 3 is a cross-sectional view showing part of a VCSEL as an example of a gallium nitride material semiconductor device incorporating a third embodiment of a p-contact according to the invention.

FIG. 3 shows the VCSEL 300 as an example of a gallium nitride semiconductor device incorporating a third embodiment 330 of a p-contact according to the invention. To simplify the drawing, FIG. 3 shows only the topmost p-type gallium nitride material layer 118, the intermediate layer 332 and the metal layer 134 of the VCSEL 300. The rest of the VCSEL 300 is identical to the VCSEL 100 shown in FIG. 1 and has been omitted. Elements that are identical to those shown in FIG. 1 are indicated by the same reference numeral and will not be described again here.

In the third embodiment shown in FIG. 3, the p-contact 330 according to the invention is formed on the upper surface 124 of the topmost p-type gallium nitride material layer 118 of the upper mirror region 114. The p-contact 330 is composed of the metal layer 134 and the intermediate layer 332 sandwiched between the topmost p-type gallium nitride material layer 118 and the metal layer. In this embodiment, the material of the intermediate layer 332 is a metal nitride. Titanium nitride is the preferred metal nitride because it is conductive and will form a stable interface with a gallium nitride material.

Titanium nitride is opaque to the light generated by the VCSEL 300, and so the window 346 corresponding to the window 139 is formed in the intermediate layer 332 to allow the VCSEL to emit the light it generates. The window is formed by selectively depositing the titanium nitride, or by depositing the titanium nitride layer, and then selectively removing part of the titanium nitride layer to form the window. The preferred thickness of the titanium nitride layer is in the range of 100–1,000 Å.

The preferred material of the metal layer 134 that contacts the intermediate layer 332 is titanium. Other examples of the composition of the metal layer include a layered structure composed of layers of nickel and gold, with an optional additional layer of aluminum deposited on the layer of gold, and single layers of aluminum or gold. The metal layer 134 is deposited on the surface 338 of the intermediate layer 332.

The intermediate layer 332 provides the p-contact 330 with a lower contact resistance than a conventional p-contact for gallium nitride materials because it prevents the metal layer 134 from removing nitrogen from the gallium nitride material. Consequently, no donor sites that neutralize the acceptor sites in the p-type gallium nitride material are formed, and the effective doping level of the p-type gallium nitride material is close to that predicted from the concentration of acceptor impurities in the gallium nitride material. The higher effective doping level in the p-type gallium nitride material results in a narrower depletion zone in the gallium nitride material.

Figure 4:
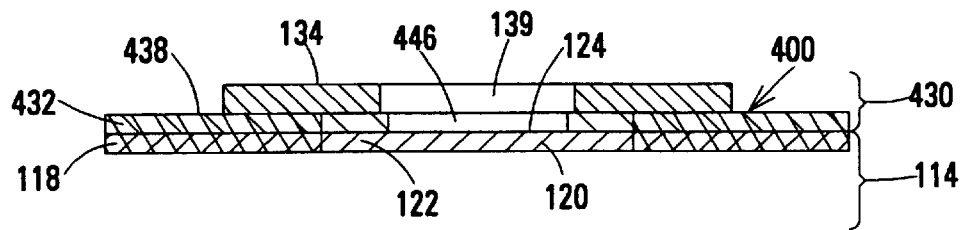
FIG. 4 is a cross-sectional view showing part of a VCSEL as an example of a gallium nitride material semiconductor device incorporating a fourth embodiment of a p-contact according to the invention.

FIG. 4 shows the VCSEL 400 as an example of a gallium nitride semiconductor device incorporating a fourth embodiment 430 of a p-contact according to the invention. To simplify the drawing, FIG. 4 shows only the topmost p-type gallium nitride material layer 118, the intermediate layer 432 and the metal layer 134 of the VCSEL 400. The rest of the VCSEL 400 is identical to the VCSEL 100 shown in FIG. 1 and has been omitted. Elements that are identical to those shown in FIG. 1 are indicated by the same reference numeral and will not be described again here.

In the fourth embodiment shown in FIG. 4, the p-contact 430 according to the invention is formed on the upper surface 124 of the topmost p-type gallium nitride material layer 118 of the upper mirror region 114. The p-contact 430 is composed of the metal layer 134 and the intermediate layer 432 sandwiched between the topmost p-type gallium nitride material layer 118 and the metal layer. In this embodiment, the material of the intermediate layer 432 is p-type gallium arsenide nitride, $GaAs_xN_{(1-x)}$, in which the mole fraction x of arsenic atoms changes from close to zero next to the topmost p-type gallium nitride material layer 118 to a substantially higher value next to the metal layer 134, and in which the mole fraction (1−x) of nitrogen atoms changes in a complementary way. The mole fractions of arsenic atoms and of nitrogen atoms may change progressively or in steps. The gallium arsenide nitride of the intermediate layer is doped to as high a level as possible with a suitable acceptor impurity, such as carbon or magnesium.

In the intermediate layer 432, the gallium arsenide nitride next to the surface 124 of the topmost p-type gallium nitride material layer 118 is similar to gallium nitride, because the value of the mole fraction x is close to zero. Thus, the portion of the gallium arsenide nitride next to the topmost p-type gallium nitride material layer has a band-gap energy close to that of the gallium nitride material of the layer 118. The mole fraction x of arsenic atoms in the gallium arsenide nitride of the intermediate layer increases towards the surface 438. As the mole fraction x increases, the band-gap energy of the gallium arsenide nitride decreases. The mole fraction x of arsenic atoms is controlled so that it reaches a value at or near a maximum at the surface 438 of the intermediate layer. The mole fraction x at the surface 438 is preferably in the range from about 0.2 to about 0.7. A mole fraction x in this range reduces the band-gap energy of the gallium arsenide nitride to below about one electron-volt, and results in a low potential barrier between the intermediate layer and the metal layer 134.

The most preferred range of the arsenic mole fraction x near the surface 438 of the intermediate layer 432 is from about 0.5 to about 0.6. With a mole fraction x in this range, the band-gap energy of gallium arsenide nitride is so low that the material has electrical conduction properties similar to those of a metal. The potential barrier between the gallium arsenide nitride of the intermediate layer and the metal layer 134 is close to zero, so the surface 438 is an ideal surface on which to deposit the metal layer 134. A minimum in the band-gap energy of gallium arsenide nitride occurs with an arsenic mole fraction x of about 0.55. Increasing the arsenic mole fraction beyond about 0.55 causes the band-gap energy to increase.

Figure 5A:
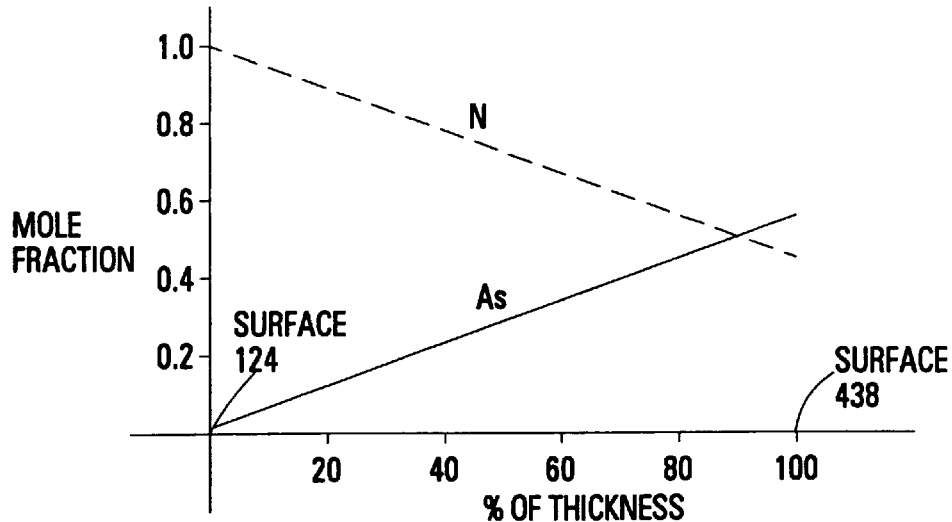
FIGS. 5A and 5B show how the mole fractions of arsenic atoms and nitrogen atoms vary through the thickness of the intermediate layer of the fourth embodiment.
Figure 5B:
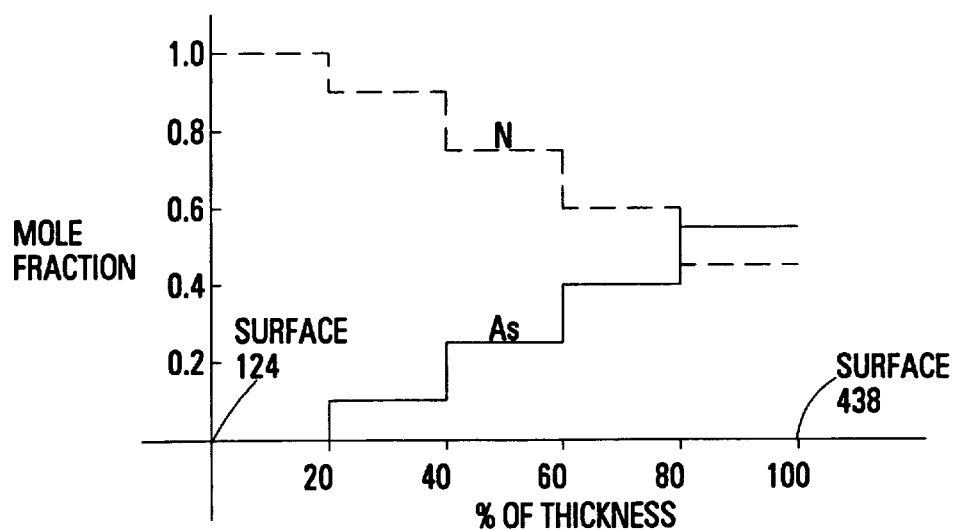

FIGS. 5A and 5B show how the arsenic mole fraction x and the nitrogen mole fraction 1−x vary in the intermediate layer 432 between the surface 124 of the topmost p-type gallium nitride material layer 118 and the surface 438 of the intermediate layer. In FIG. 5A, the arsenic mole fraction changes progressively from a minimum close to the surface 124 to a value of about 0.55 near the surface 438. In FIG. 5B, the arsenic fraction changes in steps from a minimum close to the surface 124 to a value of about 0.55 near the surface 438. The arsenic and nitrogen mole fractions may be changed in fewer or more steps than those shown.

The portion of the gallium arsenide nitride of the intermediate layer 432 near the surface 438 has a low band-gap voltage and so will normally be opaque to the light generated by the VCSEL 400. Consequently, the window 446 corresponding to the window 139 is formed in the intermediate layer to allow the VCSEL to emit the light it generates. The window is formed by selectively depositing the gallium arsenide nitride, or by depositing the gallium arsenide nitride layer, and then selectively removing part of the gallium arsenide nitride layer to form the window. The preferred thickness of the gallium arsenide nitride layer is in the range of several hundred to several thousand Ångstroms.

The preferred material of the metal layer 134 that contacts the intermediate layer 432 is titanium. Other examples of the composition of the metal layer include a layered structure composed of layers of nickel and gold, with an optional additional layer of aluminum deposited on the layer of gold, a layered structure composed of layers of titanium, platinum and gold, and single layers of platinum, palladium, gold or nickel. The metal layer 134 is deposited on the surface 438 of the intermediate layer 432.

The intermediate layer 432 can be grown in the same MOCVD reactor as the other layers constituting the VCSEL 400 are grown. The intermediate layer can also be grown as a continuation of the process used to grow the other layers. The layer structure from which the VCSEL is made can be grown in a conventional nitride-process MOCVD reactor modified to include an arsine feed.

After the topmost p-type gallium nitride material layer 118 has reached its desired thickness, deposition of the p-type gallium nitride material is continued to grow the intermediate layer 432, and a low flow rate of arsine is introduced into the reactor so that gallium arsenide nitride is deposited as the intermediate layer. During initial growth of the intermediate layer, the flow rate of the arsine is low so that the mole fraction of arsenic atoms in the gallium arsenide nitride is close to zero, as shown in FIGS. 5A and 5B.

Additionally, a flow of a suitable acceptor (p-type) impurity such as carbon or magnesium is maintained into the reactor to dope the gallium arsenide nitride at as high an impurity concentration as possible. The flow rate of the impurity is consistent with that of a impurity concentration of about $10^{20}$ atoms.cm$^{-3}$. However, since the impurity incorporation rate of gallium arsenide nitride in which the arsenic mole fraction is small is similar to that of gallium nitride, the activated impurity concentration in the portion of the intermediate layer close to the surface 124 is only about $10^{18}$ atoms.cm$^{-3}$.

As the thickness of the gallium arsenide nitride constituting the intermediate layer 432 increases, the flow rate of the arsine is increased and the flow rate of the nitrogen is decreased so that the mole fraction of arsenic atoms in the gallium arsenide nitride increases, and that of the nitrogen atoms decreases, as shown in FIGS. 5A and 5B. Changes in the flow rates can be made progressively, as shown in FIG. 5A or in steps, as shown in FIG. 5B. The flow rates are adjusted so that the mole fraction of arsenic atoms in the gallium arsenide nitride reaches a desired value when the intermediate layer reaches its desired thickness. As noted above, the desired value is preferably in the range of 0.2 to 0.7, and is more preferably in the range of 0.5 to 0.6.

As the thickness of the gallium arsenide nitride constituting the intermediate layer 432 increases and the mole fraction of arsenic atoms increases, the incorporation of activated acceptor impurities increases. With current processing technology, a maximum activated impurity concentration of greater than $10^{20}$ atoms.cm$^{-3}$ can be achieved. As the gallium arsenide nitride reaches its thickness, the impurity flow may be discontinued. This is because the band-gap energy of the gallium arsenide nitride is so low near the surface 438 that no doping is required to provide it with adequate electrical conductivity.

The intermediate layer 432 may alternatively be formed from gallium phosphide nitride, $GaP_yN_{(1-y)}$. The band-gap energy of gallium phosphide nitride varies with the phosphorus mole fraction y in a manner similar to that in which the band-gap energy of gallium arsenide nitride varies with the arsenic mole fraction. The minimum in the band-gap energy of gallium phosphide nitride corresponds to a phosphorus mole fraction of about 0.55. Also, a mole fraction of the gallium atoms in the gallium arsenide nitride or gallium phosphide nitride of the intermediate layer may be replaced with aluminum, indium, or aluminum and indium atoms.

An electrical contact of the type just described, in which the intermediate layer is a layer of a gallium nitride material in which a mole fraction of the nitrogen atoms have been replaced by a mole fraction x of atoms of another Group V element, can also be used to provide a low resistance, low voltage-drop electrical contact to an n-type gallium nitride material, i.e., an n-contact. In this case, the gallium nitride material of the intermediate layer is doped with a suitable donor impurity such as silicon or selenium.

Although this disclosure describes illustrative embodiments of the invention in detail, it is to be understood that the invention is not limited to the precise embodiments described, and that various modifications may be practiced within the scope of the invention defined by the appended claims.

What is claimed is:

1. An electrical contact for a semiconductor device, the electrical contact comprising:

a layer of p-type gallium nitride doped with a first level of activated acceptor impurities, and having a band-gap energy;

a metal layer; and an intermediate layer of a Group III–V semiconductor having a band-gap energy lower than the band-gap energy of the p-type gallium nitride, the intermediate layer being sandwiched between the layer of the p-type gallium nitride and the metal layer, the Group III–V semiconductor of the intermediate layer being doped with a second level of activated acceptor impurities, the second level being greater than the first level.

2. An electrical contact for a semiconductor device, the electrical contact comprising:

a layer of p-type gallium nitride material having a band-gap energy;

a metal layer; and an intermediate layer of a gallium nitride material having a band-gap energy lower than the band-gap energy of the p-type gallium nitride, the intermediate layer being sandwiched between the layer of the p-type gallium nitride and the metal layer.

3. The electrical contact of claim 2, in which:

the gallium nitride material is doped with a first level of activated acceptor impurities; and the gallium nitride material of the intermediate layer is doped with a second level of activated acceptor impurities, the second level being greater than the first level.

4. An electrical contact for a semiconductor device, the electrical contact comprising:

a layer of a p-type gallium nitride material, the p-type gallium nitride material being doped with a first level of activated acceptor impurities;

a metal layer; and an intermediate layer of a material different from the gallium nitride material and the metal, the intermediate layer being sandwiched between the layer of the p-type gallium nitride material and the metal layer and including layers of different Group III–V semiconductors each having a band-gap energy, the layers of the different Group III–V semiconductors being arranged in order of band-gap energies, with the Group III–V semiconductor having the highest band-gap energy next to the layer of the p-type gallium nitride material, and the Group III–V semiconductor having the lowest band-gap energy next to the metal layer, the different semiconductors being doped with respective second levels of activated acceptor impurities, the second levels each being greater than the first level.

5. The electrical contact of claim 4, in which the layers of the different semiconductors include a layer of a different gallium nitride material next to the layer of the gallium nitride material.

6. An electrical contact for a semiconductor device, the electrical contact comprising:

a layer of a p-type gallium nitride material;

a metal layer; and an intermediate layer of a material different from the gallium nitride material and the metal, the intermediate layer being sandwiched between the layer of the p-type gallium nitride material and the metal layer and including layers of different Group III–V semiconductors each having a band-gap energy, the layers of the different Group III–V semiconductors being arranged in order of band-gap energies, with the Group III–V semiconductor having the highest band-gap energy next to the layer of the p-type gallium nitride material, and the Group III–V semiconductor having the lowest band-gap energy next to the metal layer, the Group III–V semiconductor having the highest band-gap energy being gallium phosphide.

7. The electrical contact of claim 6, in which:

the gallium nitride material is doped with a first level of activated acceptor impurities; and the Group III–V semiconductors of the intermediate layer are doped with respective second levels of activated acceptor impurities, the second levels each being greater than the first level.

8. An electrical contact for a semiconductor device, the electrical contact comprising:

a layer of a p-type gallium nitride material;

a metal layer; and an intermediate layer of a material different from the gallium nitride material and the metal, the intermediate layer being sandwiched between the layer of the p-type gallium nitride material and the metal layer, the intermediate layer including:
 a layer of gallium phosphide (GaP) next to the layer of the p-type gallium nitride material,
 a layer of aluminum indium gallium phosphide (AlInGaP) next to the layer of GaP, and
 a layer of indium gallium phosphide (InGaP) sandwiched between the layer of AlInGaP and the metal layer.

9. The electrical contact of claim 8, in which:

the gallium nitride material is doped with a first level of activated acceptor impurities; and the Group III–V semiconductors of the intermediate layer are doped with respective second levels of activated acceptor impurities, the second levels each being greater than the first level.

10. An electrical contact for a semiconductor device, the electrical contact comprising:

a layer of a p-type gallium nitride material;

a metal layer; and an intermediate layer of a material different from the gallium nitride material and the metal, the intermediate layer being sandwiched between the layer of the p-type gallium nitride material and the metal layer and including layers of different Group III–V semiconductors each having a band-gap energy, the layers of the different Group III–V semiconductors being arranged in order of band-gap energies, with the Group III–V semiconductor having the highest band-gap energy next to the layer of the p-type gallium nitride material, and the Group III–V semiconductor having the lowest band-gap energy next to the metal layer, the layers of the different semiconductors including a layer of gallium arsenide nitride next to the metal layer.

11. The electrical contact of claim 10, in which:

the gallium nitride material is doped with a first level of activated acceptor impurities; and the Group III–V semiconductors of the intermediate layer are doped with respective second levels of activated acceptor impurities, the second levels each being greater than the first level.

12. An electrical contact for a semiconductor device, the electrical contact comprising:

a layer of a doped gallium nitride material;

a metal layer; and a intermediate layer sandwiched between the layer of the doped gallium nitride material and the metal layer, the intermediate layer being a gallium nitride material in which:
 a mole fraction (1−x) of nitrogen atoms are replaced by a mole fraction x of atoms of at least one other Group V element, and
 the mole fraction x in the intermediate layer is a minimum next to the doped gallium nitride material, and is substantially greater than zero next to the metal layer.

13. The electrical contact of claim 12, in which:

the material of the intermediate layer has a band-gap energy; and the mole fraction x in the intermediate layer next to the metal layer has a value that reduces the band-gap energy of the material of the intermediate layer next to the metal layer to a level at which the material has electrical conduction properties similar to those of a metal.

14. The electrical contact of claim 12, in which the mole fraction x in the intermediate layer next to the metal layer has a value that sets the band-gap energy of the material of the intermediate layer next to the metal layer to less than one electron-volt.

15. The electrical contact of claim 12, in which:

the at least one of other Group V element is one of arsenic and phosphorus; and the mole fraction x in the portion of the intermediate layer next to the metal layer has a value in the range 0.2 to 0.7.

16. The electrical contact of claim 12, in which:

the at least one of other Group V element is one of arsenic and phosphorus; and the mole fraction x in the portion of the intermediate layer next to the metal layer has a value in the range 0.5 to 0.6.

17. The electrical contact of claim 12, in which the layer of the doped gallium nitride material and the intermediate layer are both doped with acceptor impurities to form a p-contact.

18. An electrical contact for a semiconductor device, the electrical contact comprising:

a layer of a p-type gallium nitride material, the p-type gallium nitride material having a band-gap energy;

a metal layer; and an intermediate layer of a Group III–V semiconductor other than a Group III-nitride semiconductor, the Group III–V semiconductor having a band-gap energy lower than the band-gap energy of the p-type gallium nitride material, the intermediate layer being sandwiched between the layer of the p-type gallium nitride material and the metal layer.

19. The electrical contact of claim 18, in which:

the gallium nitride material is doped with a first level of activated acceptor impurities; and the Group III–V semiconductor of the intermediate layer is doped with a second level of activated acceptor impurities, the second level being greater than the first level.

20. The electrical contact of claim 18, in which the material of the intermediate layer includes gallium phosphide (GaP).

* * * * *